(12) United States Patent  
Sole et al.

(10) Patent No.: US 11,817,864 B2  
(45) Date of Patent: Nov. 14, 2023

(54) TIMING SYSTEM INCLUDING A MASTER DEVICE AND AT LEAST A SLAVE DEVICE SYNCHRONIZED WITH EACH OTHER AND RELATED SYNCHRONIZATION METHOD

(71) Applicant: STMicroelectronics S.r.l., Agrate Brianza (IT)

(72) Inventors: Luigi Sole, Milan (IT); Antonio Giordano, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/839,813

(22) Filed: Jun. 14, 2022

(65) Prior Publication Data

US 2022/0416794 A1    Dec. 29, 2022

(30) Foreign Application Priority Data

Jun. 28, 2021   (IT) ................. 102021000016841

(51) Int. Cl.
  *H03L 7/099*   (2006.01)
  *G06F 1/08*    (2006.01)
  *G06F 1/12*    (2006.01)

(52) U.S. Cl.
  CPC ............. *H03L 7/099* (2013.01); *G06F 1/08* (2013.01); *G06F 1/12* (2013.01)

(58) Field of Classification Search
  None
  See application file for complete search history.

(56) References Cited

U.S. PATENT DOCUMENTS

| | | | |
|---|---|---|---|
| 2004/0249982 A1 | 12/2004 | Arnold et al. | |
| 2006/0056560 A1* | 3/2006 | Aweya ................. | H04J 3/0664 375/356 |
| 2012/0050086 A1* | 3/2012 | Ito ......................... | H03M 1/60 341/155 |
| 2015/0071309 A1 | 3/2015 | Aweya et al. | |

* cited by examiner

*Primary Examiner* — Cassandra F Cox (74) *Attorney, Agent, or Firm* — Slater Matsil, LLP (57) ABSTRACT

In an embodiment a timing system includes a master timing device including a master oscillator stage configured to receive a reference signal and to generate a first main clock signal frequency-locked with the reference signal, a master timing stage including a master counter configured to update value with a timing that depends on the first main clock signal, the master timing stage configured to generate a first local clock signal of a pulsed type, a timing of pulses of the first local clock signal being controllable by the master counter and a master synchronization stage configured to generate a synchronization signal synchronous with the first local clock signal, wherein the synchronization signal includes a corresponding pulse for each group of consecutive pulses of the first local clock signal formed by a number (N) of pulses, and a slave timing device including a slave oscillator stage configured to receive the reference signal and to generate a second main clock signal frequency-locked with the reference signal, a slave timing stage and a slave synchronization stage.

19 Claims, 7 Drawing Sheets

TIMING SYSTEM INCLUDING A MASTER DEVICE AND AT LEAST A SLAVE DEVICE SYNCHRONIZED WITH EACH OTHER AND RELATED SYNCHRONIZATION METHOD

CROSS-REFERENCE TO RELATED APPLICATIONS

This application claims the benefit of Italian Application No. 102021000016841, filed on Jun. 28, 2021, which application is hereby incorporated herein by reference.

TECHNICAL FIELD

The present invention relates to a timing system including a master device and at least a slave device synchronized with each other, as well as to the corresponding method for synchronizing the master device and the slave device.

BACKGROUND

As is known, timing systems are currently available including, each, at least one pair of integrated electronic devices, which are mounted in a same electronic control unit (ECU) and have local oscillators, on which base they generate corresponding groups of timing signals, also known as clock signals, which are then supplied to external electronic devices. For example, such timing systems are commonly used in the automotive field, where the clock signals generated by each integrated electronic device are supplied to corresponding switching regulators, which in turn generate voltages which are then used in airbag actuation systems equipping a vehicle.

In greater detail, each integrated electronic device is able to generate the clock signals of the respective group so that they meet predetermined phase relationships, for example in order to prevent the occurrence of power consumption peaks due to the simultaneous actuation of the corresponding switching regulators, and therefore in order to control the power dissipation. However, the lack of control of the time relationships present between the clock signals generated by the two different integrated electronic devices limits the ability of controlling the overall dissipated power.

SUMMARY

Embodiments provide a timing system which allows the drawbacks of the prior art to be overcome at least in part.

Other embodiments provide an improved timing system and related method.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
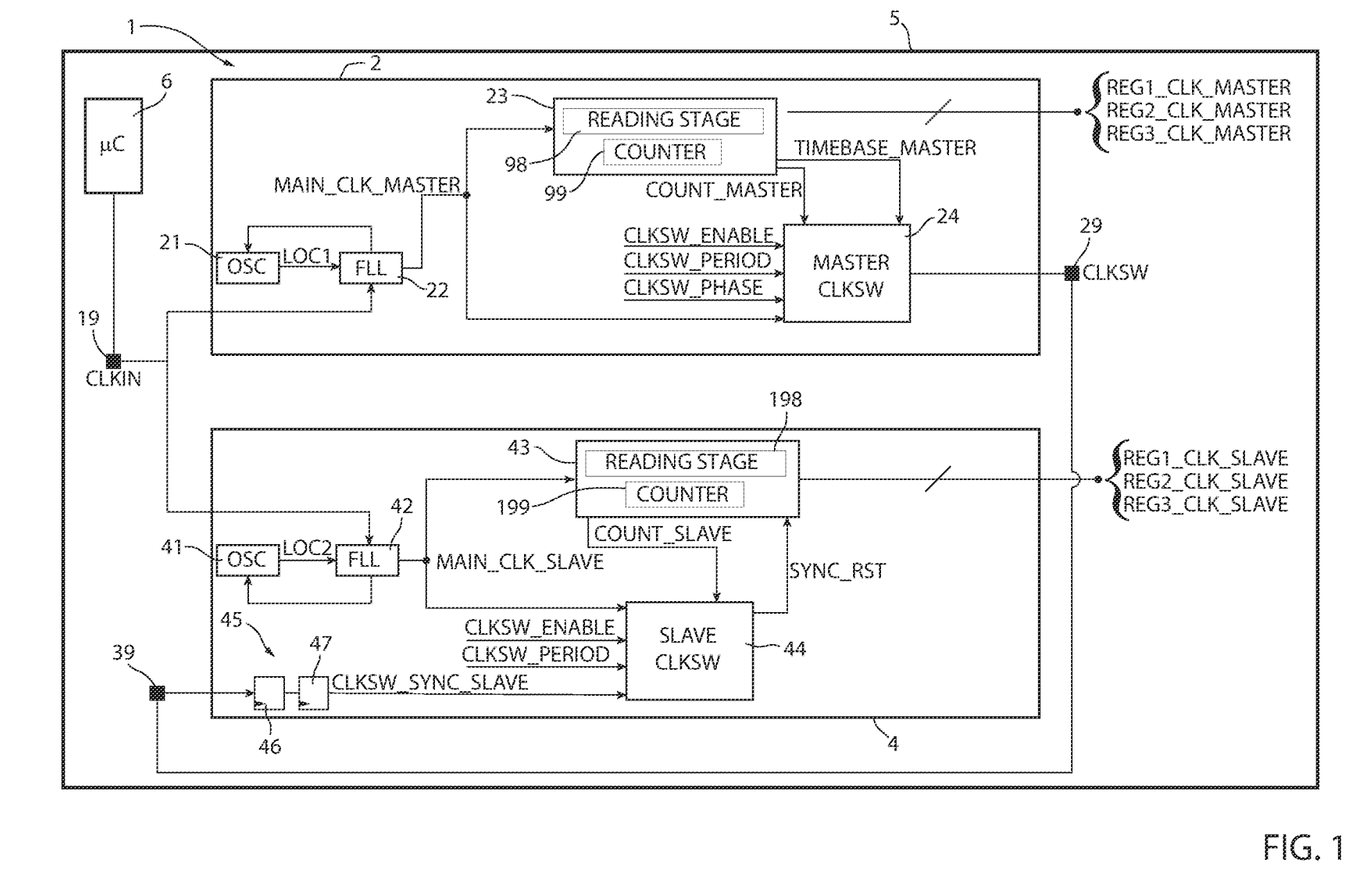
FIG. 1 shows a block diagram of an electronic control unit including a timing system.

FIG. 1 shows a timing system 1 comprising a first and a second integrated electronic device 2, 4, which form an electronic control unit 5. The electronic control unit 5 further comprises a microcontroller unit 6, which generates, on a respective pin 19, a signal CLKIN, which is for example a square wave signal with a duty cycle equal to 50% and with a nominal frequency equal to 4 MHz; the frequency accuracy of the signal CLKIN is for example equal to ±1%.

The first integrated electronic device 2 comprises a respective local oscillator 21, a respective comparison stage 22, a respective output stage 23 and a master synchronization stage 24.

In greater detail, the local oscillator 21 is a (for example) voltage-controlled variable oscillator, which generates a local signal LOC1, which is for example a square wave signal with a duty cycle equal to 50% and with a nominal frequency for example equal to 16 MHz; the frequency accuracy of the local signal LOC1 is for example equal to ±5%.

The comparison stage 22 is connected to the local oscillator 21 and to the pin 19, so as to receive the local signal LOC1 and the signal CLKIN. Furthermore, the comparison stage 22 controls, by a respective first output, the local oscillator 21 and generates, on a respective second output, a signal MAIN_CLK_MASTER (shown in FIG. 3), which is for example a square wave signal with a duty cycle equal to 50% and with nominal frequency equal to the nominal frequency of the local signal LOC1 (therefore, for example equal to 16 MHz), the frequency accuracy of the signal MAIN_CLK_MASTER being equal to the frequency accuracy of the signal CLKIN (therefore, for example equal to ±1%).

Although not shown, in a per se known manner the comparison stage 22 may include a frequency divider for generating a reference signal from the signal CLKIN, with a division factor equal to four, so that the reference signal has the same nominal frequency as the local signal LOC1, as well as the same frequency accuracy as the signal CLKIN. Furthermore, the comparison stage 22 generates a comparison signal (not shown) indicative of the difference between the frequency of the local signal LOC1 and the frequency of the reference signal; this comparison signal is generated on the first output of the comparison stage 22, so that it controls the local oscillator 21.

In practice, the local oscillator 21 and the comparison stage 22 form a frequency-locked loop; the frequency of the signal MAIN_CLK_MASTER is then locked to the frequency of the signal CLKIN.

Hereinafter, the frequency of the signal MAIN_CLK_MASTER is referred to as the frequency $f_o$.

Figure 2:
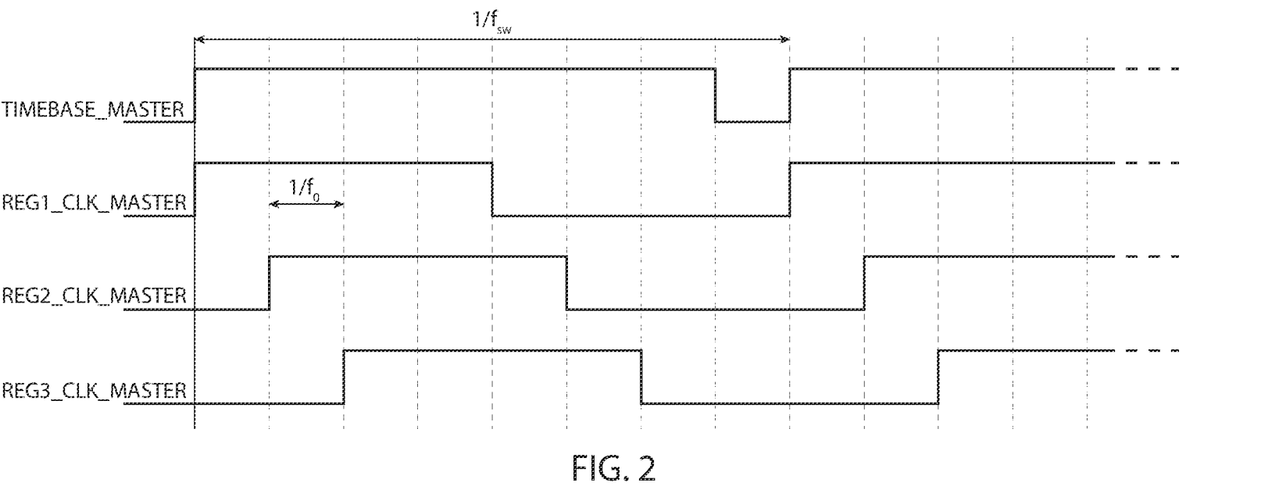
FIGS. 2, 4 and 5 show time plots of signals generated by integrated electronic devices.

The output stage 23 receives the signal MAIN_CLK_MASTER and generates a signal TIMEBASE_MASTER, an example of which is shown in FIG. 2. Furthermore, the output stage 23 generates a plurality of respective clock signals; for example, the output stage 23 generates three clock signals, indicated with REG1_CLK_MASTER, REG2_CLK_MASTER and REG3_CLK_MASTER (examples shown in FIG. 2); the signals REG1_CLK_MASTER, REG2_CLK_MASTER and REG3_CLK_MASTER are supplied on corresponding pins (not shown) of the first integrated electronic device 2.

In detail, the signal TIMEBASE_MASTER has a frequency $f_{SW}$ which is equal to the frequency $f_o$ divided by an integer K; for example, in the present description it is assumed K=8, therefore the frequency $f_{SW}$ of the signal TIMEBASE_MASTER is equal to 2 MHz. Furthermore, the signals REG1_CLK_MASTER, REG2_CLK_MASTER and REG3_CLK_MASTER have the same frequency $f_{SW}$ as the signal TIMEBASE_MASTER and are temporally shifted with respect to the TIMEBASE_MASTER, with phase shifts equal to multiples of the period $1/f_o$.

Purely by way of example, in the example shown in FIG. 2, the signal REG1_CLK_MASTER is temporally aligned with the signal TIMEBASE_MASTER, while the signals REG2_CLK_MASTER and REG3_CLK_MASTER are lagging with respect to the signal TIMEBASE_MASTER, by a lag equal to $1/f_o$ and by a lag equal to $2/f_o$, respectively; furthermore, again by way of example, it is assumed that the signals REG1_CLK_MASTER, REG2_CLK_MASTER and REG3_CLK_MASTER have duty cycles equal to 50%, while the signal TIMEBASE_MASTER has a duty cycle equal to 87-5%.

In greater detail, in order to generate the signal TIMEBASE_MASTER and the signals REG1_CLK_MASTER, REG2_CLK_MASTER and REG3_CLK_MASTER, the output stage 23 implements a reading stage 98 and a counter 99, whose (integer) value is comprised between 0 and K-1 and is increased by one unit on each rising edge of the signal MAIN_CLK_MASTER (once the value K-1 is reached, the count restarts from zero); furthermore, the output stage 23 generates a signal COUNT_MASTER (shown in FIG. 3), which is indicative, at any instant, of the value of the counter 99.

In use, the reading stage 98 reads the counter 99 on each rising edge of the signal MAIN_CLK_MASTER. Furthermore, the rising edges of the signal TIMEBASE_MASTER (indicated with $F_{UP}$ and corresponding apexes, for reasons explained below) are generated whenever the reading stage 98 reads that the counter 99 has assumed the value one, for example; this reading occurs, with respect to the instant in which the counter 99 has actually assumed the value one, with a lag equal to a pulse of the signal MAIN_CLK_MASTER, therefore it occurs at the instant in which the counter 99 becomes equal to two. In other words, referring to the events to indicate the times in which the counter 99 assumes the value two, each rising edge of the signal TIMEBASE_MASTER occurs when a corresponding event occurs.

Similarly, the falling edges of the signal TIMEBASE_MASTER, indicated with $F_{DOWN}$, are generated whenever the reading stage 98 reads that the counter 99 has assumed the value zero, for example; this reading occurs, with respect to the instant in which the counter 99 has actually assumed the value zero, with a lag equal to a pulse of the signal MAIN_CLK_MASTER, therefore it occurs at the instant in which the counter 99 becomes equal to one.

The same considerations apply for the generation of the rising and falling edges of the signals REG1_CLK_MASTER, REG2_CLK_MASTER and REG3_CLK_MASTER. In other words, considering any signal between the signals REG1_CLK_MASTER, REG2_CLK_MASTER and REG3_CLK_MASTER, the respective rising edges and the respective falling edges are associated with a corresponding first threshold and with a corresponding second threshold; when the value of the counter 99 read by the reading stage 98 is equal to the first threshold, a corresponding rising edge of the signal is generated, whereas when the value of the counter 99 read by the reading stage 98 is equal to the second threshold, a corresponding falling edge of the signal is generated. The signals REG1_CLK_MASTER, REG2_CLK_MASTER and REG3_CLK_MASTER are therefore synchronous with respect to the signal TIMEBASE_MASTER and each of them is phase shifted with respect to the signal TIMEBASE_MASTER by a corresponding (possibly, null) number of pulses of the signal MAIN_CLK_MASTER.

The signals MAIN_CLK_MASTER, TIMEBASE_MASTER and COUNT_MASTER are supplied to the master synchronization stage 24, which also receives the signals CLKSW_ENABLE, CLKSW_PERIOD and CLKSW_PHASE, which are generated by the microcontroller unit 6, and generates a synchronization signal CLKSW, which is made available on a corresponding pin 29 of the first integrated electronic device 2.

In greater detail, the signal CLKSW_PERIOD is indicative of an integer number N (for example comprised between 1 and 31). The signal CLKSW_PHASE is indicative of a lag $\varphi$, which is equal to an integer for example comprised between 0 and K-1; in the remainder of the present description it is assumed that $\varphi$ is for example equal to two. Furthermore, the signal CLKSW_ENABLE enables the execution of the phase alignment operations described subsequently; in the following it is assumed that the signal CLKSW_ENABLE is equal to the logic value '1', unless otherwise specified.

This having been said, as shown qualitatively in FIG. 4, the synchronization signal CLKSW includes, for each group formed by N (in FIG. 4, N=3) consecutive pulses (equivalently, rising edges) of the signal TIMEBASE_MASTER, a corresponding pulse, whose rising edge (indicated with $UP_{CLKSW}$) meets a predetermined time relationship with this group of N pulses, and therefore with the signal COUNT_MASTER, as shown in detail in FIG. 3 and explained below. In this regard, in FIGS. 3 and 4, the rising edges of the first, the second and the third pulses of each group of three consecutive pulses of the signal TIMEBASE_MASTER are indicated with $F_{up}'$, $F_{up}''$ and $F_{up}'''$, respectively.

Figure 3:
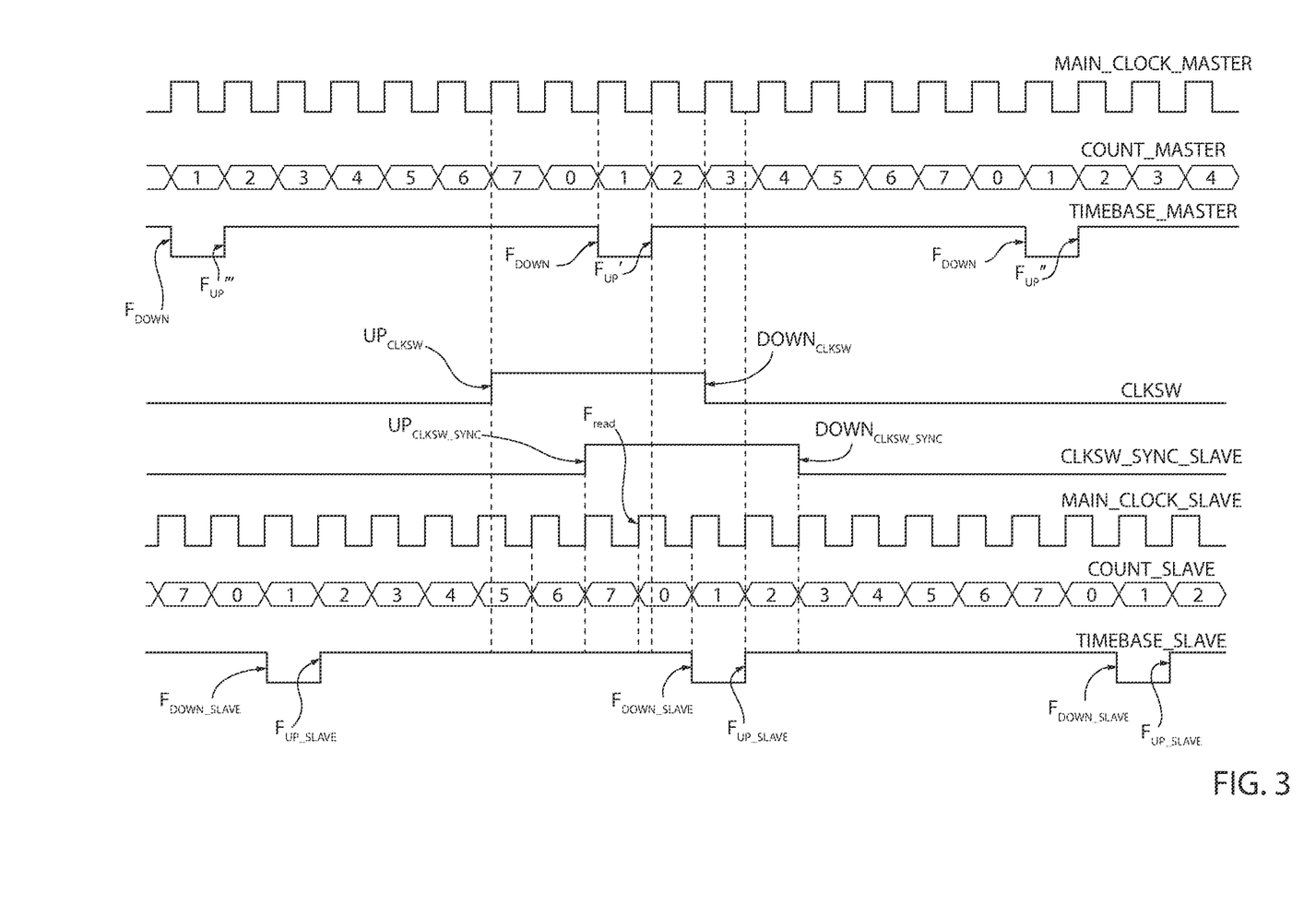
FIGS. 3, 7 and 8 show time plots of signals from the present timing system.
Figure 4:
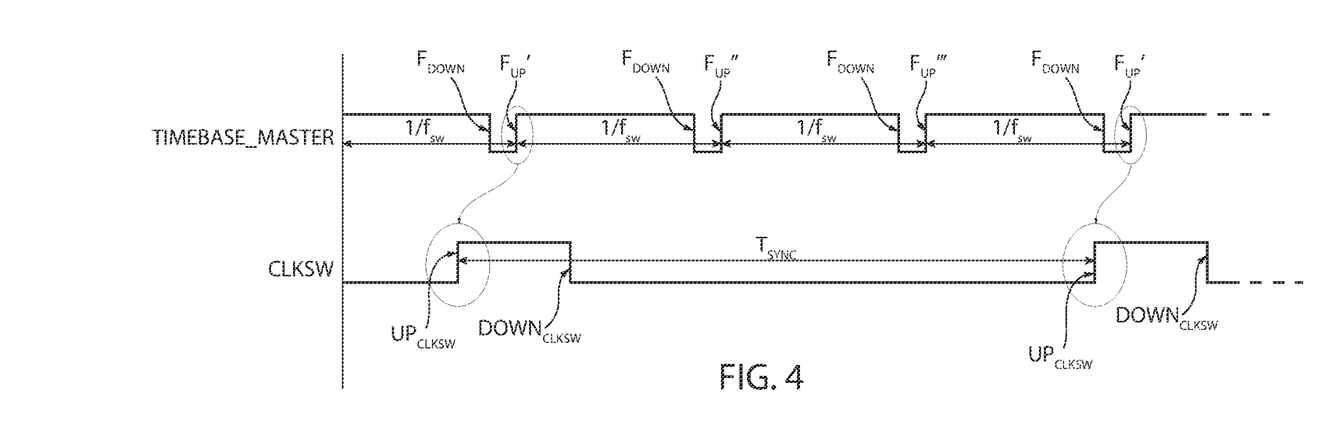

In greater detail, as visible in FIG. 3, the rising edge $UP_{CLKSW}$ of the synchronization signal CLKSW is in advance with respect to the aforementioned rising edge $F_{up}'$ of the first pulse of the corresponding group of N pulses of the signal TIMEBASE_MASTER, by a number of pulses of the signal MAIN_CLK_MASTER for example equal to 5-$\varphi$, therefore equal to three. In other words, in this example, the rising edge $UP_{CLKSW}$ is generated when the signal COUNT_MASTER, and therefore the counter 99, becomes equal to seven for the last time before the aforementioned rising edge $F_{up}'$ occurs; to this end, the master synchronization stage 24 may be configured to generate the rising edge $UP_{CLKSW}$ after it has read that the signal COUNT_MASTER has assumed the value six.

Furthermore, the synchronization signal CLKSW has a respective falling edge (indicated with $DOWN_{CLKSW}$), which occurs with a lag equal to (for example) four cycles of the signal MAIN_CLK_MASTER, with respect to the rising edge $UP_{CLKSW}$; in other words, in this example, the falling edge $DOWN_{CLKSW}$ occurs when the signal COUNT_MASTER becomes equal to three for the first time after the aforementioned rising edge $F_{up}'$ has occurred.

In practice, the synchronization signal CLKSW has a period equal to $T_{SYNC}=N*(1/f_{SW})$; furthermore, as explained below, the synchronization signal CLKSW allows the first and the second integrated electronic devices 2, 4 to be synchronized.

The second integrated electronic device 4 comprises a respective local oscillator 41, a respective comparison stage 42, a respective output stage 43 and a slave synchronization stage 44; in addition, the second integrated electronic device 4 comprises a synchronous acquisition circuit 45, which includes a first and a second flip-flop 46, 47, for example of clocked type on the rising edge.

The local oscillator 41 is a (for example) voltage-controlled variable oscillator, which generates a local signal LOC2, which is for example a square wave signal with a duty cycle equal to 50% and with a nominal frequency for example equal to 16 MHz; the frequency accuracy of the local signal LOC2 is for example equal to ±5%.

The comparison stage 42 is connected to the local oscillator 41 and to the pin 19, so as to receive the local signal LOC2 and the signal CLKIN. Furthermore, the comparison stage 42 controls, by a respective first output, the local oscillator 41 and generates, on a respective second output, a signal MAIN_CLK_SLAVE (shown in FIG. 3), which is for example a square wave signal with a duty cycle equal to 50% and with nominal frequency equal to the nominal frequency of the local signal LOC2, the frequency accuracy of the signal MAIN_CLK_SLAVE being equal to the frequency accuracy of the signal CLKIN.

Although not shown, the comparison stage 42 of the second integrated electronic device 4 may operate in the same manner described with reference to the comparison stage 22 of the first integrated electronic device 2.

In practice, the local oscillator 41 and the comparison stage 42 of the second integrated electronic device 4 form a frequency-locked loop such that the frequency of the signal MAIN_CLK_SLAVE is locked to the frequency of the signal CLKIN. Furthermore, hereinafter the frequency of the signal MAIN_CLK_SLAVE is referred to as the frequency $f_o'$; the frequencies $f_o'$ and $f_o$ are locked to each other, thanks to the locking to the frequency of the signal CLKIN.

The first and the second flip-flops 46, 47 are timed by the signal MAIN_CLK_SLAVE, that is, although not shown, they receive the latter signal on respective clock inputs. Furthermore, the input terminal of the first flip-flop 46 is connected to a pin 39 of the second integrated electronic device 4, which in turn is connected to the pin 29 of the first integrated electronic device 2, so as to receive the synchronization signal CLKSW. The input terminal of the second flip-flop 47 is connected to the output terminal of the first flip-flop 46, in such a way that a resynchronized signal CLKSW_SYNC_SLAVE is present on the output terminal of the second flip-flop 47.

In particular, as shown in FIG. 3, given any transition of the synchronization signal CLKSW, i.e. given any rising edge $UP_{CLKSW}$ or falling edge $DOWN_{CLKSW}$, the resynchronized signal CLKSW_SYNC_SLAVE replicates this transition after, following the aforementioned transition of the synchronization signal CLKSW, two rising edges of the signal MAIN_CLK_SLAVE have occurred. In other words, referring for example to any rising edge $UP_{CLKSW}$ of the synchronization signal CLKSW, the resynchronized signal CLKSW_SYNC_SLAVE has a corresponding rising edge (indicated with $UP_{CLKSW\_SYNC}$), which occurs at the second rising edge of the signal MAIN_CLK_SLAVE which occurs after the rising edge $UP_{CLKSW}$; the rising edge $UP_{CLKSW\_SYNC}$ is therefore lagged, with respect to the rising edge $UP_{CLKSW}$, by a time equal to a maximum of $2*(1/f_o')$. The same considerations also apply to any falling edge $DOWN_{CLKSW}$ of the synchronization signal CLKSW and to the corresponding falling edge (indicated with $DOWN_{CLKSW\_SYNC}$) of the resynchronized signal CLKSW_SYNC_SLAVE.

The resynchronized signal CLKSW_SYNC_SLAVE is supplied to the slave synchronization stage 44, together with the signal MAIN_CLK_SLAVE and with the signals CLKSW_ENABLE and CLKSW_PERIOD, so that the slave synchronization stage 44 may generate a signal SYNC_RST, as described below.

Figure 5:
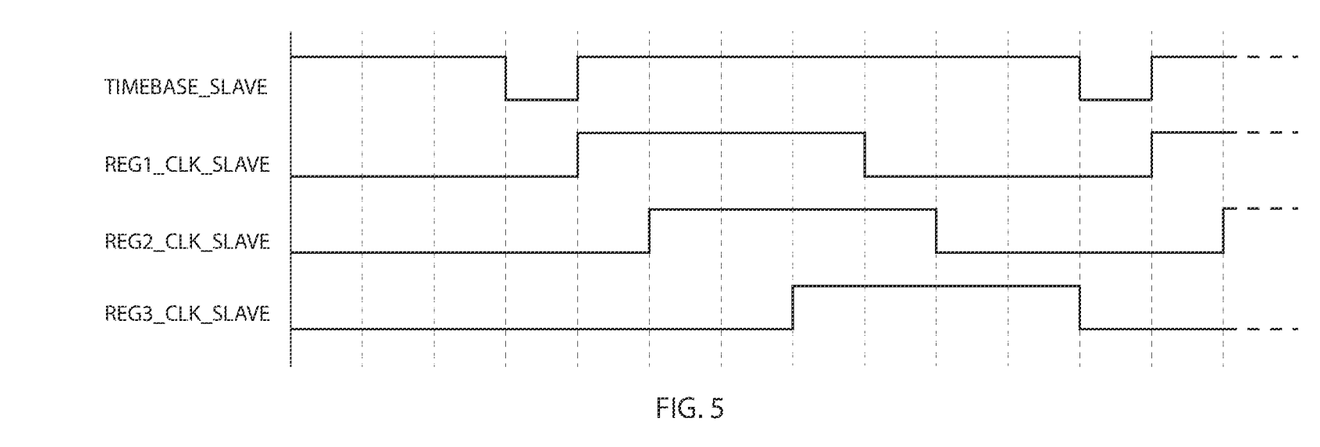

The output stage 43 receives the signal MAIN_CLK_SLAVE and the signal SYNC_RST and, as described in greater detail below, generates a signal TIMEBASE_SLAVE, an example of which is qualitatively shown in FIG. 5. Furthermore, the output stage 43 generates a plurality of respective clock signals; for example, the output stage 43 generates three clock signals, indicated in FIG. 5 with REG1_CLK_SLAVE, REG2_CLK_SLAVE and REG3_CLK_SLAVE; the signals REG1_CLK_SLAVE, REG2_CLK_SLAVE and REG3_CLK_SLAVE are supplied on corresponding pins (not shown) of the second integrated electronic device 4 and are synchronous, but temporally shifted, with respect to TIMEBASE_SLAVE. Purely by way of example, in the example shown in FIG. 5, the signal REG1_CLK_SLAVE is temporally aligned with the signal TIMEBASE_SLAVE, while the signals REG2_CLK_SLAVE and REG3_CLK_SLAVE are lagged, with respect to the signal TIMEBASE_SLAVE, by one pulse of the signal MAIN_CLK_SLAVE_CLAVE and by three pulses of the signal MAIN_CLAVE_SLAVE, respectively; furthermore, again by way of example, it is assumed that the signals REG1_CLK_SLAVE, REG2_CLK_SLAVE and REG3_CLK_SLAVE have a duty cycle equal to 50%.

In greater detail, in order to generate the signal TIMEBASE_SLAVE and the signals REG1_CLK_SLAVE, REG2_CLK_SLAVE and REG3_CLK_SLAVE, the output stage 43 cooperates with the slave synchronization stage 44 and implements a respective reading stage 198 and a respective counter 199, whose (integer) value is comprised between 0 and K−1 and is increased by one unit on each rising edge of the signal MAIN_CLK_SLAVE (once the value K−1 is reached, the count restarts from zero), except for the exceptions being described hereinbelow. Furthermore, the output stage 43 generates a signal COUNT_SLAVE (shown in FIG. 3), which is indicative, at any instant, of the value of the counter 199.

In use, the reading stage 198 reads the counter 199 on each rising edge of the signal MAIN_CLK_SLAVE. Furthermore, whenever the reading stage 198 reads that the counter 199 has assumed, for example, the value one, a rising edge (indicated with $F_{UP\_SLAVE}$) of the signal TIMEBASE_SLAVE is generated; this reading occurs, with respect to the instant in which the counter 199 has actually assumed the value one, with a lag equal to a pulse of the signal MAIN_CLK_SLAVE, therefore it occurs at the instant in which the counter 199, and therefore the signal COUNT_SLAVE, becomes equal to two.

Furthermore, whenever the reading stage 198 reads that the counter 199 has assumed, for example, the value zero, a falling edge (indicated with $F_{DOWN\_SLAVE}$) of the signal TIMEBASE_SLAVE is generated. This reading occurs, with respect to the instant in which the counter 199 has actually assumed the value zero, with a lag equal to a pulse of the signal MAIN_CLK_SLAVE.

Although not shown in detail, the same considerations apply for the generation of the rising and falling edges of the signals REG1_CLK_SLAVE, REG2_CLK_SLAVE and REG3_CLK_SLAVE. In other words, considering any signal between the signals REG1_CLK_SLAVE, REG2_CLK_SLAVE and REG3_CLK_SLAVE, the respective rising edges and the respective falling edges are associated with a corresponding first threshold and with a corresponding second threshold; when the value of the counter 199 read by the reading stage 198 is equal to the first threshold, a corresponding rising edge of the signal is generated, whereas when the value of the counter 199 read by the reading stage 198 is equal to the second threshold, a corresponding falling edge of the signal is generated. Consequently, as previously mentioned, the signals REG1_CLK_SLAVE, REG2_CLK_SLAVE and REG3_CLK_SLAVE are synchronous with respect to the signal TIMEBASE_SLAVE and each of them is phase shifted with respect to the signal TIMEBASE_SLAVE by a corresponding number of pulses of the signal MAIN_CLK_SLAVE.

Figure 6:
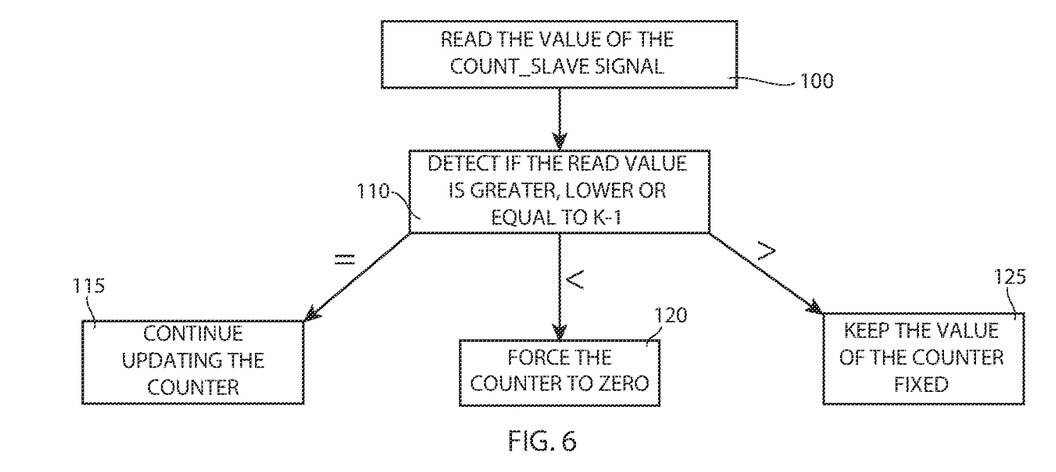
FIG. 6 shows a block diagram relating to operations carried out by the present timing system.

The output stage 43 supplies the signal COUNT_SLAVE to the slave synchronization stage 44, which, on each rising edge $UP_{CLKSW\_SYNC}$ of the resynchronized signal CLKSW_SYNC_SLAVE, performs the operations shown in FIG. 6.

In particular, the slave synchronization stage 44 reads (block 100) the value of the signal COUNT_SLAVE, and therefore reads the value of the counter 199, and detects (block 110) whether the read value is greater, smaller than or equal to an expected value for example equal to K−1 (it should be remembered that in the present description it has been assumed, for example, K=8). For example, the reading of the value of the signal COUNT_SLAVE, and therefore of the counter 199, occurs with a lag, with respect to the rising edge $UP_{CLKSW\_SYNC}$ of the resynchronized signal CLKSW_SYNC_SLAVE, equal to one pulse of the signal MAIN_CLOCK_SLAVE.

If the read value is equal to K−1 (output indicated with '=' of block 110), the slave synchronization stage 44 refrains from interfering with the updating of the counter 199 of the second integrated electronic device 4; in other words, the output stage 43 continues to continuously update (block 115) the value of the counter 199, according to the pulses of the signal MAIN_CLK_SLAVE.

This situation is shown for example in FIG. 3, wherein, when the rising edge $UP_{CLKSW\_SYNC}$ occurs, the signal COUNT_SLAVE (and therefore the counter 199) assumes the value seven, this value being then read by the slave synchronization stage 44 on the next rising edge of the signal MAIN_CLK_SLAVE, which is indicated with $F_{read}$. In this situation, the slave synchronization stage 44 assigns a respective first information value to the signal SYNC_RST; the output stage 43 reads the first information value of the signal SYNC_RST and, consequently, continues to update the value of the counter 199 on each rising edge of the signal MAIN_CLK_SLAVE; therefore, on the aforementioned rising edge $F_{read}$ and then on the first rising edge of the signal MAIN_CLOCK_SLAVE following the rising edge $F_{read}$, the counter 199 assumes the value zero and the value one, respectively; these values are read, with a lag of one pulse of the signal MAIN_CLK_MASTER, by the reading stage 198 of the second integrated electronic device 4, with consequent generation of a falling edge $F_{DOWN\_SLAVE}$ of the signal TIMEBASE_SLAVE, when the counter 199 (and therefore the signal COUNT_SLAVE) assumes the value one, and then of a rising edge $F_{UP\_SLAVE}$ of the signal TIMEBASE_SLAVE, when the counter 199 (and therefore the signal COUNT_SLAVE) assumes the value two. The rising edge $F_{UP\_SLAVE}$ of the signal TIMEBASE_SLAVE therefore occurs after, following the rising edge $F_{UP}'$ of the signal TIMEBASE_MASTER, a number of rising edges of the signal MAIN_CLOCK_SLAVE equal to the lag φ (i.e., equal to two, in the present example) have occurred.

In practice, if the read value is equal to K−1, it means that the counter 199 of the second integrated electronic device 4 is phase shifted with respect to the counter 99 of the first integrated electronic device 2 in such a way that the rising edge $F_{UP\_SLAVE}$ of the signal TIMEBASE_SLAVE is phase shifted, with respect to the rising edge $F_{UP}'$ of the signal TIMEBASE_MASTER, by a number of rising edges of the signal MAIN_CLOCK_SLAVE equal to φ, without any need for tunings (phase resynchronizations) of the counter 199 of the second integrated electronic device 4. The phase shift between the signals TIMEBASE_SLAVE and TIMEBASE_MASTER is therefore approximately equal to a number of pulses of the signal MAIN_CLK_SLAVE (equivalently, of the signal MAIN_CLK_MASTER) equal to φ, therefore it is equal to the desired phase shift.

Again with reference to FIG. 6, if the read value is instead equal to K−1−1 (output '<' of block 110), it means that the counter 199 of the second integrated electronic device 4 is lagging with respect to the value it should have to ensure the desired phase shift between the rising edge $F_{UP\_SLAVE}$ of the signal TIMEBASE_SLAVE and the rising edge $F_{UP}'$ of the signal TIMEBASE_MASTER.

Figure 7:
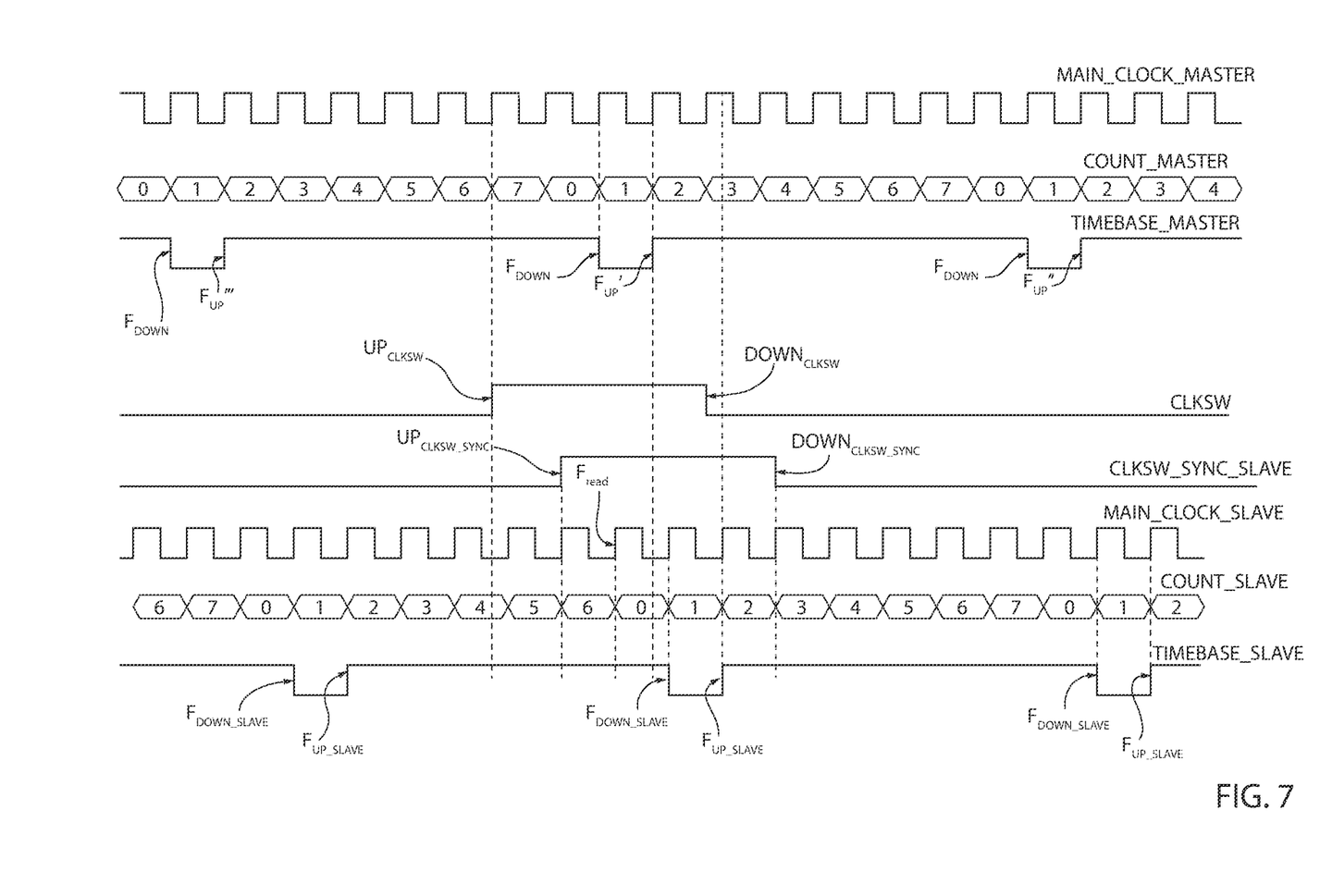

Consequently, the slave synchronization stage 44 assigns a second information value to the signal SYNC_RST, so as to control the output stage 43 for skipping a number in the updating of the counter 199 of the second integrated electronic device 4, as shown in FIG. 7. In other words, by assigning the second information value to the signal SYNC_RST, the slave synchronization stage 44 controls the output stage 43 so that the latter, on the rising edge $F_{read}$ of the signal MAIN_CLK_SLAVE, forces (block 120) in advance to zero the counter 199, instead of allowing the counter 199 to assume the value K−1 (seven, in the example); consequently, on the first rising edge of the signal MAIN_CLOCK_SLAVE following the rising edge $F_{read}$, the counter 199 then assumes the value one. The falling edge $F_{DOWN\_SLAVE}$ and the rising edge $F_{UP\_SLAVE}$ of the signal TIMEBASE_SLAVE are generated again when the counter 199 (and therefore the signal COUNT_SLAVE) assumes the value one and the value two, respectively. Similarly to what has been described with reference to FIG. 3, the rising edge $F_{UP\_SLAVE}$ of the signal TIMEBASE_SLAVE therefore occurs after, following the rising edge $F_{UP}'$ of the signal TIMEBASE_MASTER, a number of rising edges of the signal MAIN_CLOCK_SLAVE equal to the lag φ (i.e., equal to two, in the present example) have occurred.

In practice, if the read value is equal to K−1-1, the counter 199 of the second integrated electronic device 4 is forced in advance to zero, i.e. a number is skipped, so as to temporarily accelerate the updating of the counter 199 and cancel (as a first approximation) the lag with respect to the counter 99 of the first integrated electronic device 2; in this manner the desired phase shift is obtained between the rising edge $F_{UP\_SLAVE}$ of the signal TIMEBASE_SLAVE and the rising edge $F_{UP}'$ of the signal TIMEBASE_MASTER.

Again with reference to FIG. 6, if the read value is instead equal to zero (output '>' of block 11o), it means that the counter 199 of the second integrated electronic device 4 is in advance with respect to the value it should have to ensure the desired phase shift between the rising edge $F_{UP\_SLAVE}$ of the signal TIMEBASE_SLAVE and the rising edge $F_{UP}'$ of the signal TIMEBASE_MASTER.

Figure 8:
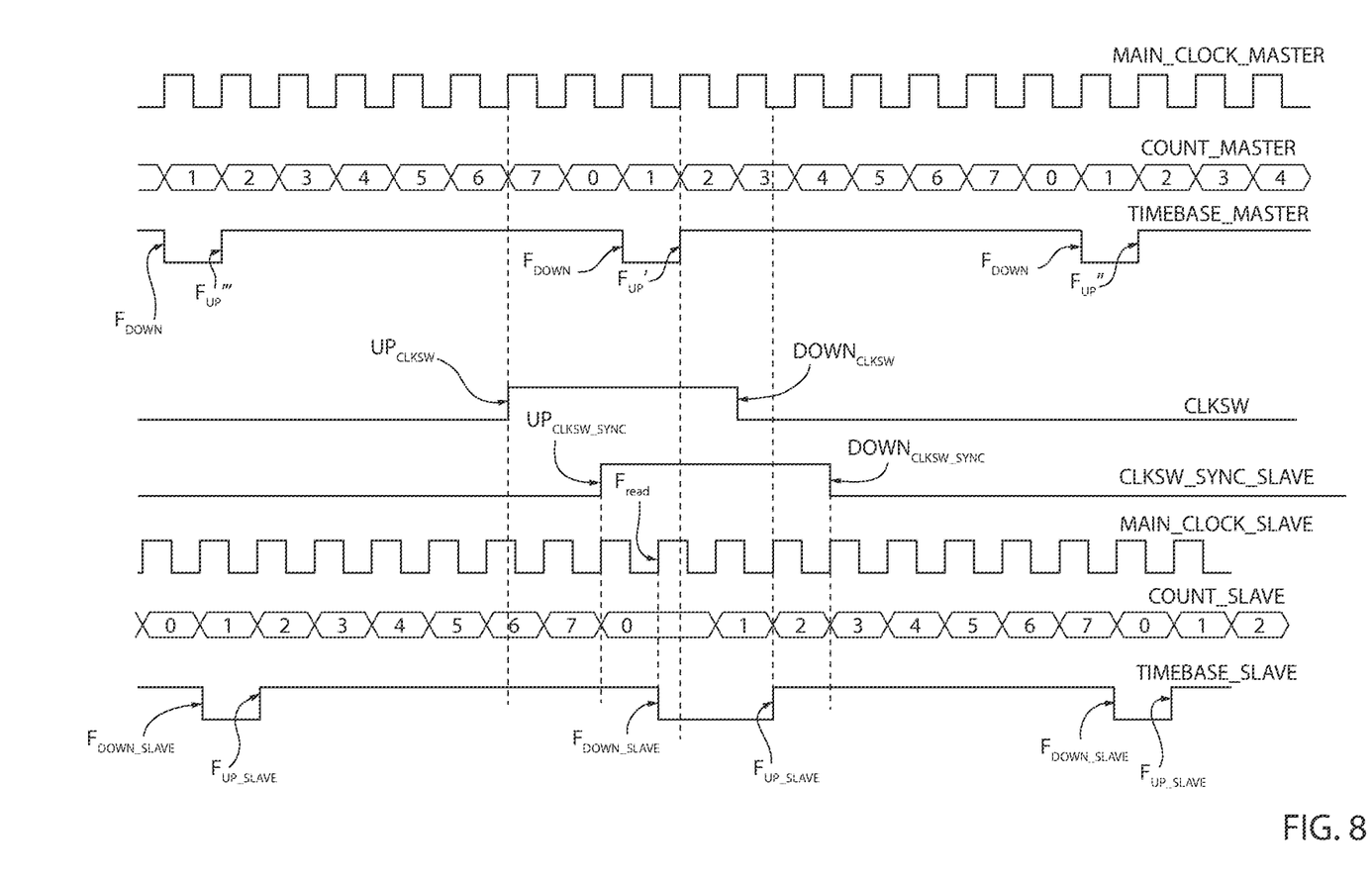

Consequently, as shown in FIG. 8, the slave synchronization stage 44 assigns a third information value to the signal SYNC_RST, so as to control the output stage 43 for keeping the value of the counter 199 of the second integrated electronic device 4 fixed (block 125) for a further pulse of the signal MAIN_CLK_SLAVE. In other words, on the rising edge $F_{read}$ of the signal MAIN_CLK_SLAVE, the output stage 43 keeps fixed at zero the value of the counter 199 of the second integrated electronic device 4, which will begin to be updated again on the subsequent rising edge of the signal MAIN_CLK_SLAVE. Furthermore, since, on the rising edge $F_{read}$ of the signal MAIN_CLK_SLAVE, the reading stage 198 reads the value zero of the counter 199, the output stage 43 generates a falling edge $F_{DOWN\_SLAVE}$ of the signal TIMEBASE_SLAVE, whose subsequent rising edge $F_{UP\_SLAVE}$ is generated when the output stage 43 reads the value one of the counter 199, that is on the second rising edge of the signal MAIN_CLK_SLAVE following the rising edge $F_{read}$. In this manner, even in the scenario shown in FIG. 8, the rising edge $F_{UP\_SLAVE}$ of the signal TIMEBASE_SLAVE occurs after, following the rising edge $F_{UP}'$ of the signal TIMEBASE_MASTER, a number of rising edges of the signal MAIN_CLOCK_SLAVE equal to the lag φ (i.e., equal to two, in the present example) have occurred.

In practice, if the read value is equal to zero, the updating of the counter 199 of the second device is inhibited for a pulse of the signal MAIN_CLK_SLAVE, so as to temporarily slow down the updating of the counter 199 of the second integrated electronic device 4 with respect to the updating of the counter 99 of the first integrated electronic device 2 and obtain the desired phase shift between the rising edge $F_{UP\_SLAVE}$ of the signal TIMEBASE_SLAVE and the rising edge $F_{UP}'$ of the signal TIMEBASE_MASTER.

In general, the second integrated electronic device 4 carries out a reading of the counter 199 and a comparison of the read value with an expected value, and subsequently tunes the value of the counter 199 so as to maintain the phase-locking with the counter 99 of the first integrated electronic device 4.

Furthermore, in case the signal CLKSW_ENABLE is set equal to the logic value '0' by the microcontroller unit 6, the phase-locking of the signals TIMEBASE_MASTER and TIMEBASE_SLAVE, and therefore also of the signals REG1_CLK_MASTER-REG3_CLK_MASTER and REG1_CLK_SLAVE-REG3_CLK_SLAVE, is disabled and the counters 99, 199 of the first and the second integrated electronic devices 2, 4 are increased only on the basis of the signals MAIN_CLK_MASTER and MAIN_CLK_SLAVE, respectively.

On the contrary, as regards the use, which is optional, of the signal CLKSW_PERIOD by the slave synchronization stage 44, the latter may use the information relating to the number N of pulses present in each group of consecutive pulses of the signal TIMEBASE_MASTER to implement a preliminary control, prior to performing the operations shown in FIG. 6. In particular, since the number N is known, when the slave synchronization stage 44 receives a rising edge $UP_{CLKSW\_SYNC}$ of the resynchronized signal CLKSW_SYNC_SLAVE, the slave synchronization stage 44 may verify whether this rising edge $UP_{CLKSW\_SYNC}$ actually corresponds to a rising edge $F_{up}'$ of the TIMEBASE_MASTER, in which case it performs the operations shown in FIG. 6, or it has been generated as an error, in which case the slave synchronization stage 44 refrains from executing the operations shown in FIG. 6. More generally, on the basis of the information relating to the number N and of the pulses of the resynchronized signal CLKSW_SYNC_SLAVE received, the slave synchronization stage 44 may detect the presence of anomalies.

The advantages of the present solution are clear from the foregoing description.

In practice, the synchronization signal CLKSW allows to ensure the presence of a controlled phase shift between the signal TIMEBASE_MASTER and the signal TIME_BASE_SLAVE. Between two subsequent pulses of the synchronization signal CLKSW, the timings are controlled by the signals MAIN_CLK_MASTER and MAIN_CLK_SLAVE, which are in any case frequency-locked. Furthermore, through the signal CLKSW_PERIOD, it is possible to select the number N of pulses present in each group of consecutive pulses of the signal TIMEBASE_MASTER, and therefore control the periodicity with which the pulses of the synchronization signal CLKSW are generated, and therefore the periodicity with which the possible phase resynchronization of the signal TIMEBASE_SLAVE is performed with respect to the signal TIMEBASE_MASTER. The aforementioned number N may be chosen according to the uncertainty present between the signals MAIN_CLK_MASTER and MAIN_CLK_SLAVE; the smaller this uncertainty, the greater the number N may be, so as to carry out the phase resynchronization of the signal TIMEBASE_SLAVE only when appropriate.

Therefore, the present master-slave configuration allows to (at least) double the power driving capacity, without losing the ability to suitably balance the power dissipation. Furthermore, in case the clock signals are supplied, for example, to corresponding switching regulators, the latter operate synchronously, with a consequent reduction in the overall electromagnetic emissions.

In addition, in case, for any reason, the signal CLKIN is not present on the pin 19, the first and the second integrated electronic devices 2, 4 might still continue to operate, thanks to the timings provided by the respective local oscillators 21, 41; in this case, the signals MAIN_CLK_MASTER and MAIN_CLK_SLAVE would be equal to the local signal LOC1 and to the local signal LOC2, respectively. This configuration, although losing the advantages of the synchronization previously described, still allows to generate the clock signals, to the advantage of the safety of the systems arranged downstream of the timing system 1. Similarly, the second integrated electronic device 4 continues to operate also in case a malfunction (or a reset) of the first integrated electronic device 2 and/or an interruption of the synchronization signal CLKSW occur.

Finally, it is clear that modifications and variations may be made to what has been described and illustrated, without thereby departing from the scope of the present invention, as defined in the attached claims.

For example, one or more of the operations previously described as performed at a rising edge of a signal may be performed at a falling edge of that signal. Similarly, the operations of reading the counters may occur with different timings with respect to what has been described.

The synchronous acquisition circuit 45 may be different from what has been described; for example, it may include a different number of flip-flops. The synchronous acquisition circuit 45 may also be absent, in which case the second integrated electronic device 4 does not carry out the resynchronization of the synchronization signal CLKSW. Consequently, the slave synchronization stage 44 uses the synchronization signal CLKSW, in place of the resynchronized signal CLKSW_SYNC_SLAVE.

Furthermore, the signals CLK_PERIOD and CLK_ENABLE may not be generated, in which case the number N is fixed and the synchronization is permanently enabled, therefore the system configurability is reduced. More generally, pulses of the signal CLKSW may be generated whenever the counter 99 of the first integrated electronic device 2 becomes equal to a corresponding threshold. Furthermore, the synchronization signal CLKSW may coincide with the signal TIMEBASE_MASTER, in which case the operations shown in FIG. 6 are performed for each pulse of the signal TIMEBASE_MASTER.

The signal CLKSW_PHASE may be absent, in which case the lag φ is fixed.

The generation of the rising and falling edges of the signal TIMEBASE_MASTER may occur when the reading stage 98 reads that the counter 99 has assumed values other than one and zero, respectively. Similarly, the rising and falling edges of the signal TIMEBASE_SLAVE may also be generated when the reading stage 198 reads that the counter 199 has assumed values other than one and zero.

Furthermore, all the signals previously described may have different duty cycles with respect to what has been described.

Each rising edge $UP_{CLKSW}$ of the synchronization signal CLKSW may have a timing, with respect to the corresponding rising edge $F_{up}'$ of the signal TIMEBASE_MASTER, being different with respect to what has been described, in which case also the relationship between the lag φ imposed by the microcontroller unit 6 and the phase shift between the rising edge $F_{UP\_SLAVE}$ of the signal TIMEBASE_SLAVE and the rising edge $F_{up}'$ of the signal TIMEBASE_MASTER may vary with respect to what has been described. In this regard, in general the phase shift between the rising edge $F_{UP\_SLAVE}$ of the signal TIMEBASE_SLAVE and the rising edge $F_{up}'$ of the signal TIMEBASE_MASTER depends on the number of flip-flops of the synchronous acquisition circuit 45, on the value of the counter 99 that has to be read by the reading stage 98 to cause the generation of the rising edge $F_{UP}'$, on the values of the counter 199 that have to be read by the reading stage 198 to cause the generation of a falling edge $F_{DOWN\_SLAVE}$ and of the subsequent rising edge $F_{UP\_SLAVE}$ of the signal TIMEBASE_SLAVE, as well as on the phase shift present between the rising edge $UP_{CLKSW}$ of the synchronization signal CLKSW and the corresponding rising edge $F_{UP}'$ of the signal TIMEBASE_MASTER, the latter quantity being therefore able to be calculated according to the previous quantities and the desired lag φ. Embodiments wherein the phase shift present between the rising edge $UP_{CLKSW}$ of the synchronization signal CLKSW and (for example) the corresponding rising edge $F_{up}'$ of the signal TIMEBASE_MASTER is independent of the lag (p, and wherein the rising edge $F_{read}$ in which the signal COUNT_MASTER is read is lagged, with respect to the rising edge $UP_{CLKSW\_SYNC}$, by an amount that depends on the lag (p, are also possible.

It is also possible that the temporal distance between each pulse of the synchronization signal CLKSW and the corresponding group of pulses of the signal TIMEBASE_MASTER is different from what has been described. In other words, the time relationship between each pulse of the synchronization signal CLKSW and the corresponding group of pulses of the signal may be different from what has been described and may entail a corresponding variation of the aforementioned expected value of the counter 199, mentioned with reference to FIG. 6.

In general, regardless of the time relationship present between the pulses of the synchronization signal CLKSW and the corresponding groups of pulses of the signal TIMEBASE_MASTER, the operations referred to in blocks 110, 115, 120 and 125 may be performed so as to compare the read value of the counter 199 with an expected value other than K−1.

Figure 9:
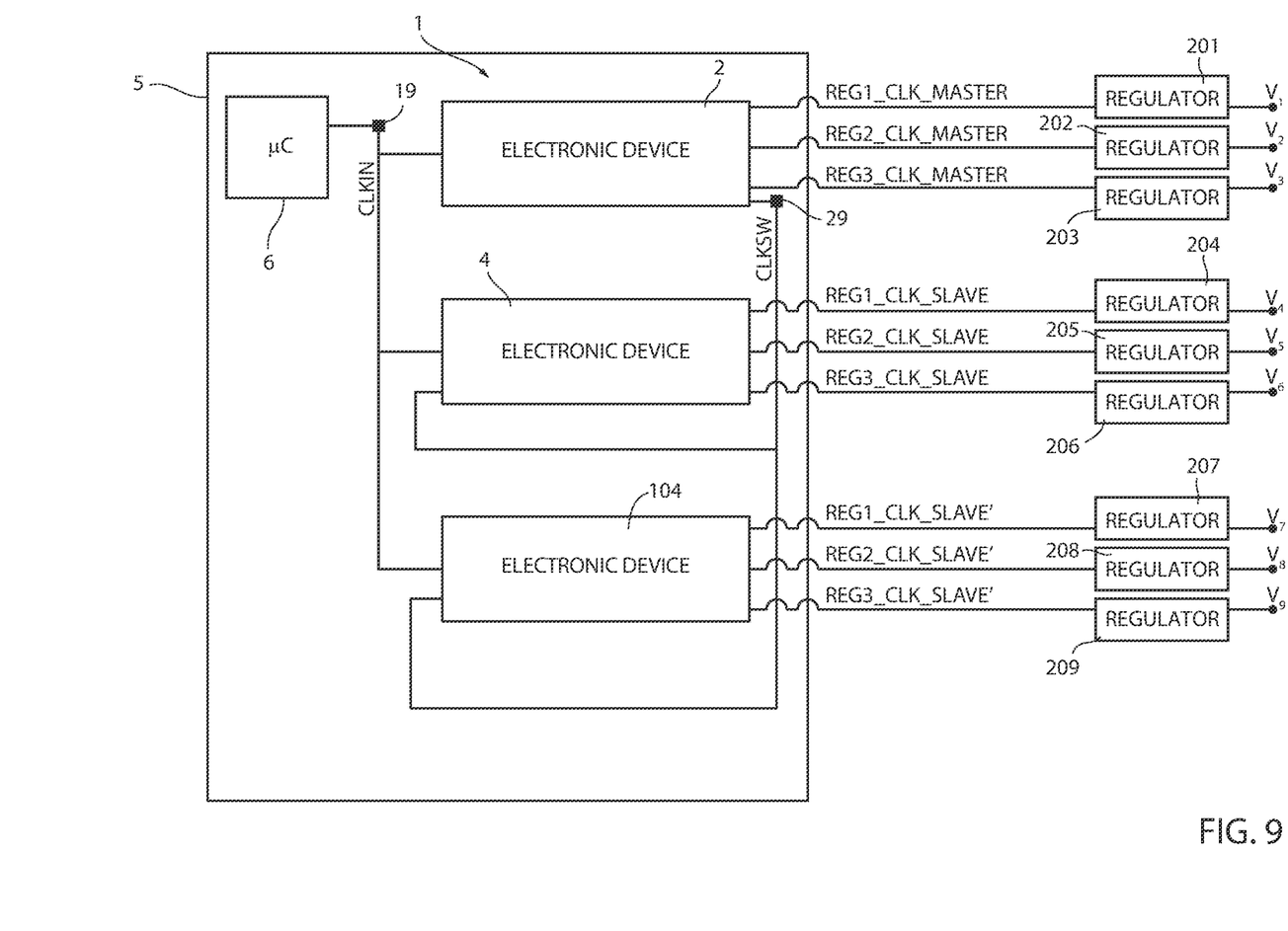
FIG. 9 shows a block diagram of a timing system coupled to switching regulators.

Finally, as mentioned previously and as shown in FIG. 9, the timing system 1 may include more than one slave device; in particular, in the example shown in FIG. 9, there is a third integrated electronic device 104, which is the same as the second integrated electronic device 4 and receives the signal CLKIN and the synchronization signal CLKSW at input. Furthermore, FIG. 9 shows how the signals REG1_CLK_MASTER, REG2_CLK_MASTER and REG3_CLK_MASTER are supplied to a first, a second and a third switching regulator 201, 202, 203, respectively, which generate the voltages $V_1$, $V_2$, $V_3$, respectively; the signals REG1_CLK_SLAVE, REG2_CLK_SLAVE and REG3_CLK_SLAVE are supplied to a fourth, a fifth and a sixth switching regulator 204, 205, 206, respectively, which generate the voltages $V_4$, $V_5$ and $V_6$, respectively. Furthermore, the third integrated electronic device 104 generates the signals REG1_CLK_SLAVE', REG2_CLK_SLAVE' and REG3_CLK_SLAVE', which are supplied to a seventh, an eighth and a ninth switching regulator 207, 208, 209, respectively, which generate the voltages $V_7$, $V_8$ and $V_9$, respectively. The voltages $V_1$-$V_9$ may be used as power supplies for corresponding devices (for example, actuators), not shown.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A timing system comprising:
   a master timing device comprising:
   a master oscillator stage configured to:
   receive a reference signal; and
   generate a first main clock signal frequency-locked with the reference signal;
   a master timing stage comprising a master counter configured to update a value with a timing that depends on the first main clock signal, the master timing stage configured to generate a first local clock signal of a pulsed type, a timing of pulses of the first local clock signal being controllable by the master counter; and
   a master synchronization stage configured to generate a synchronization signal synchronous with the first local clock signal, wherein the synchronization signal includes a corresponding pulse for each group of consecutive pulses of the first local clock signal formed by a number (N) of pulses; and
   a slave timing device comprising:
   a slave oscillator stage configured to:
   receive the reference signal; and
   generate a second main clock signal frequency-locked with the reference signal;
   a slave timing stage comprising a slave counter configured to update a value with a timing that depends on the second main clock signal, the slave timing stage configured to generate a second local clock signal of a pulsed type, the timing of the pulses of the second local clock signal being controllable by the slave counter; and
   a slave synchronization stage configured to:
   read, with a timing that depends on the synchronization signal, the value of the slave counter;
   compare the read value with an expected value; and tune the value of the slave counter according to the outcome of the comparison so as to phase-lock the first and second local dock signals.

2. The timing system according to claim 1,
wherein the first and second main clock signals are of a pulsed type,
wherein the master timing stage is configured to update the value of the master counter at each pulse of the first main clock signal,
wherein the slave timing stage is configured to update the value of the slave counter at each pulse of the second main clock signal, and
wherein the slave synchronization stage is further configured to detect, on basis of the outcome of the comparison, whether the slave counter is lagging or is in advance with respect to the expected value or whether the slave counter has a value equal to the expected value.

3. The timing system according to claim 2, wherein the slave synchronization stage is further configured to:
control the slave timing stage so as to temporarily accelerate the updating of the slave counter when the slave counter is lagging;
control the slave timing stage so as to temporarily slow down the updating of the slave counter when the slave counter is in advance; and
control the slave timing stage so that it continues to update the value of the slave counter at each pulse of the second main clock signal when the slave counter has a value equal to the expected value.

4. The timing system according to claim 2,
wherein the slave timing stage is configured to update the slave counter so that it iteratively assumes a succession of a predetermined number of values, and
wherein the slave synchronization stage is configured to:
control the slave timing stage so that the updating of the slave counter skips a value of a succession of values when the slave counter is lagging; and
control the slave timing stage so as to inhibit the updating of the slave counter for a pulse of the second main clock signal when the slave counter is in advance.

5. The timing system according to claim 1,
wherein the master timing stage is configured to generate rising edges and falling edges of the first local clock signal when the master counter assumes a first threshold value and a second threshold value, respectively, and
wherein the master synchronization stage is configured to generate each pulse of the synchronization signal so that it is temporally distant from a corresponding edge of a pulse of the corresponding group of consecutive pulses of the first local clock signal by an integer number of pulses of the first main clock signal.

6. The timing system according to claim 5,
wherein the master synchronization stage is configured to receive a first configuration signal indicative of a desired lag between the first and second local clock signals, and
wherein the integer number of pulses of the first main dock signal is a function of the desired lag.

7. The timing system according to claim 1,
wherein the slave timing device further comprises a resynchronization stage configured to generate, from the synchronization signal, a resynchronized signal having edges synchronous with the second main clock signal, and
wherein the slave synchronization stage is configured such that a timing of a reading of the slave counter depends on the resynchronized signal.

8. The timing system according to claim 7, wherein the resynchronization stage comprises a number of flip-flops connected in series and timed by the second main clock signal.

9. The timing system according to claim 1, wherein the master synchronization stage is configured to receive a second configuration signal indicative of a number (N) of pulses which form the group of consecutive pulses of the first local clock signal.

10. The timing system according to claim 1, further comprising a microcontroller configured to generate the reference signal.

11. The timing system according to claim 1,
wherein the master timing stage is further configured to generate a number of master driving signals, each of which is synchronous with the first local clock signal and is phase shifted with respect to the first local clock signal by a corresponding number of pulses of the first main clock signal, and
wherein the slave timing stage is further configured to generate a number of slave driving signals, each of which is synchronous with the second local clock signal and is phase shifted with respect to the second local clock signal by a corresponding number of pulses of the second main clock signal.

12. A system comprising:
the timing system according to claim 11; and
a plurality of switching regulators,
wherein each switching regulator is coupled to the timing system to receive a corresponding signal of the master driving signals and the slave driving signals.

13. A method for synchronizing a master timing device and a slave timing device of a timing system, wherein the master timing device comprises a master oscillator stage, a master timing stage and a master synchronization stage, and wherein the slave timing device comprises a slave oscillator stage, a slave timing stage and a slave synchronization stage, the method comprising:
generating, by the master oscillator stage, a first main clock signal frequency-locked with a reference signal;
generating, by the master timing stage, a first local clock signal of a pulsed type, a timing of the pulses of the first local clock signal being controlled by a master counter whose value is updated with a timing that depends on the first main clock signal;
generating, by the master synchronization stage, a synchronization signal synchronous with the first local clock signal, the synchronization signal comprises a corresponding pulse for each group of consecutive pulses of the first local clock signal formed by a number (N) of pulses;
generating, by the slave oscillator stage, a second main clock signal frequency-locked with the reference signal;
generating, by the slave oscillator stage, a second local clock signal of a pulsed type, a timing of the pulses of the second local clock signal being controlled by a slave counter whose value is updated with a timing that depends on the second main clock signal;
reading, by the slave synchronization stage, with a timing that depends on the synchronization signal, the value of the slave counter;
comparing, by the slave synchronization stage, the read value with an expected value; and tuning, by the slave synchronization stage, the value of the slave counter according to an outcome of a comparison so as to phase-lock the first local signal and the second local clock signals.

14. The method according to claim 13,
wherein the first and second main clock signals are of a pulsed type, and
wherein the method further comprises:
updating, by the master timing stage, the value of the master counter at each pulse of the first main clock signal,
updating, by the slave timing stage, the value of the slave counter at each pulse of the second main clock signal, and
detecting, by the slave synchronization stage, on basis of the outcome of the comparison, whether the slave counter is lagging or is in advance with respect to the expected value or whether the slave counter has a value equal to the expected value.

15. The method according to claim 14, further comprising:
controlling the slave timing stage so as to temporarily accelerate the updating of the slave counter when the slave counter is lagging;
controlling the slave timing stage so as to temporarily slow down the updating of the slave counter when the slave counter is in advance; and
controlling the slave timing stage so that it continues to update the value of the slave counter at each pulse of the second main clock signal when the slave counter has a value equal to the expected value.

16. The method according to claim 14, further comprising:
updating, by the slave timing stage, the slave counter so that it iteratively assumes a succession of a predetermined number of values;
controlling, by the slave synchronization stage, the slave timing stage so that the updating of the slave counter skips a value of the succession of values when the slave counter is lagging; and
controlling, by the slave synchronization stage, the slave timing stage so as to inhibit the updating of the slave counter for a pulse of the second main dock signal when the slave counter is in advance.

17. The method according to claim 13, further comprising:
generating, by the master timing stage, rising edges and falling edges of the first local clock signal when the master counter assumes a first threshold value and a second threshold value, respectively; and
generating, by the master synchronization stage, each pulse of the synchronization signal so that it is temporally distant from a corresponding edge of a pulse of the corresponding group of consecutive pulses of the first local clock signal by an integer number of pulses of the first main clock signal.

18. The method according to claim 17, further comprising receiving, by the master synchronization stage a configuration signal indicative of a desired lag between the first local clock signal and the second local clock signal, wherein the integer number of pulses of the first main clock signal is a function of the desired lag.

19. The method according to claim 13, further comprising:
generating from the synchronization signal, by a resynchronization stage of the slave timing device, a resynchronized signal having edges synchronous with the second main clock signal; and
reading, by the slave synchronization stage, the value of the slave counter with a timing that depends on the resynchronized signal.

* * * * *

UNITED STATES PATENT AND TRADEMARK OFFICE
CERTIFICATE OF CORRECTION

PATENT NO. : 11,817,864 B2
APPLICATION NO. : 17/839813
DATED : November 14, 2023
INVENTOR(S) : Sole et al.

Page 1 of 1

It is certified that error appears in the above-identified patent and that said Letters Patent is hereby corrected as shown below:

In the Claims

In Column 13, in Claim 1, Line 3, delete "dock" and insert -- clock --.

In Column 13, in Claim 6, Line 61, delete "dock" and insert -- clock --.

In Column 16, in Claim 16, Line 7, delete "dock" and insert -- clock --.

Signed and Sealed this
Sixth Day of February, 2024

Katherine Kelly Vidal
*Director of the United States Patent and Trademark Office*